United States Patent
Hong et al.

(10) Patent No.: US 10,885,960 B2
(45) Date of Patent: Jan. 5, 2021

(54) SPIN DEVICE, AND OPERATING METHOD THEREFOR AND MANUFACTURING METHOD THEREFOR

(71) Applicant: INDUSTRY-UNIVERSITY COOPERATION FOUNDATION HANYANG UNIVERSITY, Seoul (KR)

(72) Inventors: Jin Pyo Hong, Seoul (KR); Hae Soo Park, Seoul (KR)

(73) Assignee: INDUSTRY-UNIVERSITY COOPERATION FOUNDATION HANYANG UNIVERSITY, Seoul (KR)

(*) Notice: Subject to any disclaimer, the term of this patent is extended or adjusted under 35 U.S.C. 154(b) by 0 days.

(21) Appl. No.: 16/344,662

(22) PCT Filed: Oct. 25, 2017

(86) PCT No.: PCT/KR2017/011822
§ 371 (c)(1),
(2) Date: Apr. 24, 2019

(87) PCT Pub. No.: WO2018/080159
PCT Pub. Date: May 3, 2018

(65) Prior Publication Data
US 2020/0058339 A1    Feb. 20, 2020

(30) Foreign Application Priority Data

Oct. 25, 2016    (KR) .................... 10-2016-0139257
Oct. 25, 2016    (KR) .................... 10-2016-0139270
Oct. 25, 2016    (KR) .................... 10-2016-0139304

(51) Int. Cl.
*G11C 11/16*    (2006.01)
*G11C 11/56*    (2006.01)
(Continued)

(52) U.S. Cl.
CPC ............ *G11C 11/161* (2013.01); *G06N 3/063* (2013.01); *G11C 11/56* (2013.01); *H01L 27/222* (2013.01);
(Continued)

(58) Field of Classification Search
CPC ....... G11C 11/161; G11C 11/56; G06N 3/063; H01L 27/222; H01L 43/02; H01L 43/08; H01L 43/12
See application file for complete search history.

(56) References Cited

U.S. PATENT DOCUMENTS 8,344,433 B2 * 1/2013 Zhu ..................... H01F 10/3272
257/295
2010/0033880 A1    2/2010 Dimitrov et al.
(Continued)

FOREIGN PATENT DOCUMENTS

| KR | 10-2005-0084288 A | 8/2005 |
| KR | 10-2015-0042025 A | 4/2015 |
| KR | 10-2016-0089567 A | 7/2016 |

OTHER PUBLICATIONS

International Search Report for PCT/KR2017/011822 dated Jan. 25, 2018 [PCT/ISA/210].
(Continued)

*Primary Examiner* — Tri M Hoang
(74) *Attorney, Agent, or Firm* — Sughrue Mion, PLLC

(57) ABSTRACT

A structure and operation method of a spin device using a magnetic domain wall movement by spin orbit torque are provided. It is possible to invert the magnetization of free layer of the device at a low value of current by using the spin orbital torque, and the structure of the device is simpler than that of the conventional CMOS. Further, a spin synapse device to which a free layer of multiaxial anisotropy is applied in addition to movement of a magnetic domain wall is provided. Since the magnetoresistance can be adjusted (Continued)

according to the angle of the pinned layer and the free layer, it is easy to apply multi-bit and it can be applied to artificial synapse technology.

10 Claims, 11 Drawing Sheets

(51) Int. Cl.
  G06N 3/063   (2006.01)
  H01L 43/12   (2006.01)
  H01L 43/08   (2006.01)
  H01L 43/02   (2006.01)
  H01L 27/22   (2006.01)

(52) U.S. Cl.
  CPC .............. *H01L 43/02* (2013.01); *H01L 43/08* (2013.01); *H01L 43/12* (2013.01); *G11C 11/1675* (2013.01)

(56) References Cited

U.S. PATENT DOCUMENTS

| | | | |
|---|---|---|---|
| 2014/0269036 A1* | 9/2014 | Pi | G11C 11/18 365/158 |
| 2015/0137289 A1* | 5/2015 | Khalili Amiri | G11C 11/161 257/421 |

OTHER PUBLICATIONS

Abhronil Sengupta et al., "Proposal for an All-Spin Artificial Neural Network: Emulating Neural and Synaptic Functionalities Through Domain Wall Motion in Ferromagnets", IEEE Transactions on Biomedical Circuits and Systems, Feb. 3, 2016, pp. 1-9.

Abhronil Sengupta et al., "Magnetic Tunnel Junction Mimics Stochastic Cortical Spiking Neurons", Scientific-Reports, Jul. 21, 2016, pp. 1-8, vol. 6, No. 30039.

* cited by examiner

[FIG. 1]
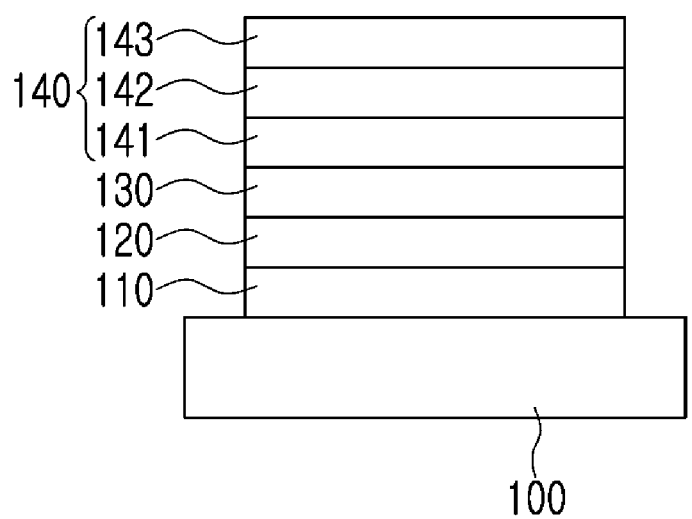
[FIG. 2]
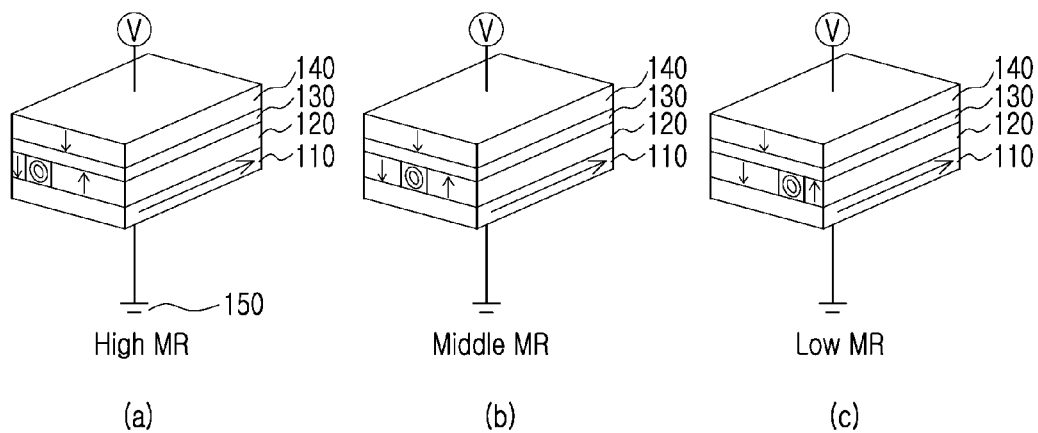
(a) High MR    (b) Middle MR    (c) Low MR

[FIG. 3]
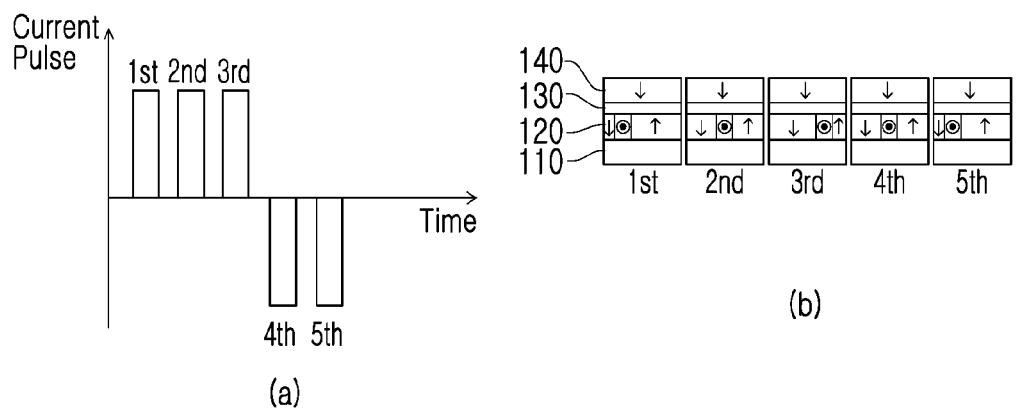
(a)
(b)
[FIG. 4]
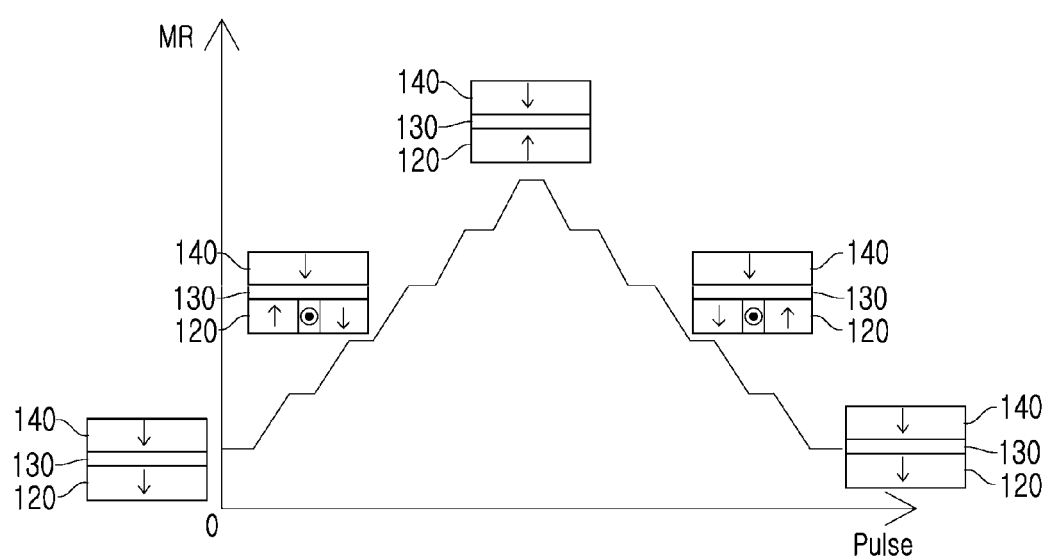

[FIG. 5]
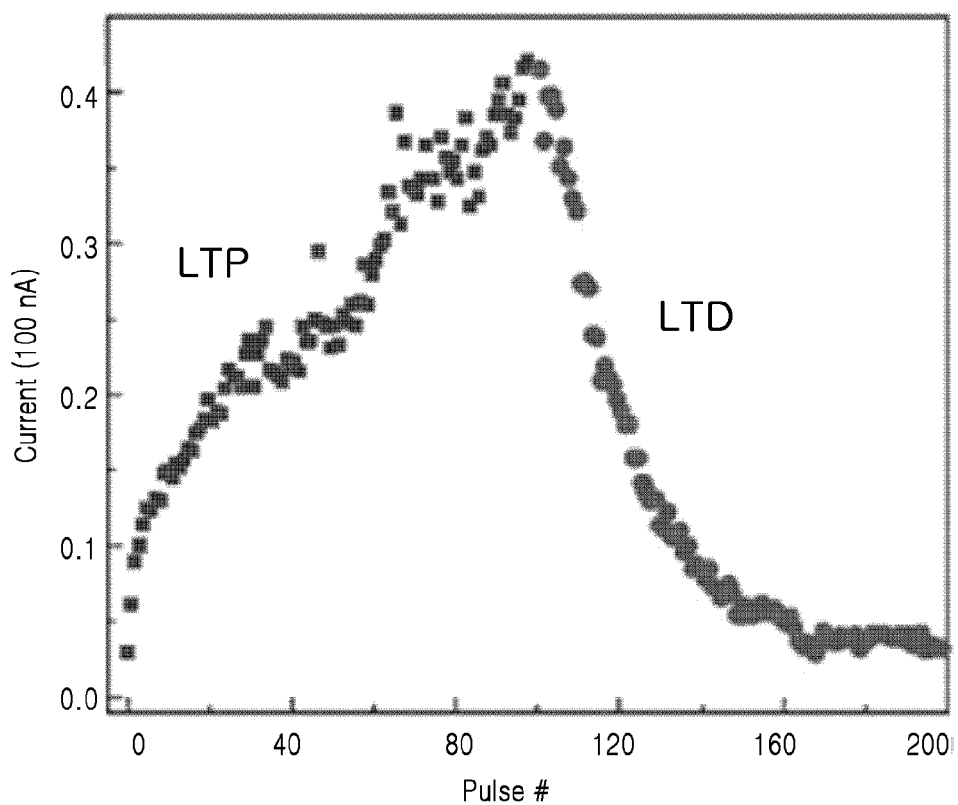
[FIG. 6]
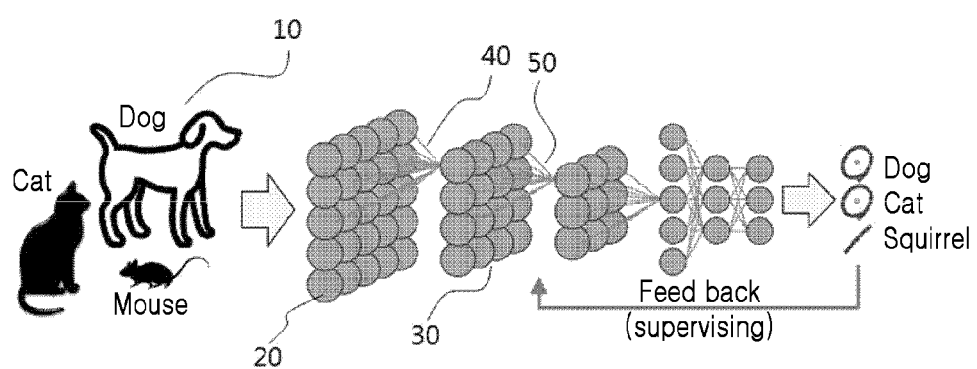

[FIG. 7]
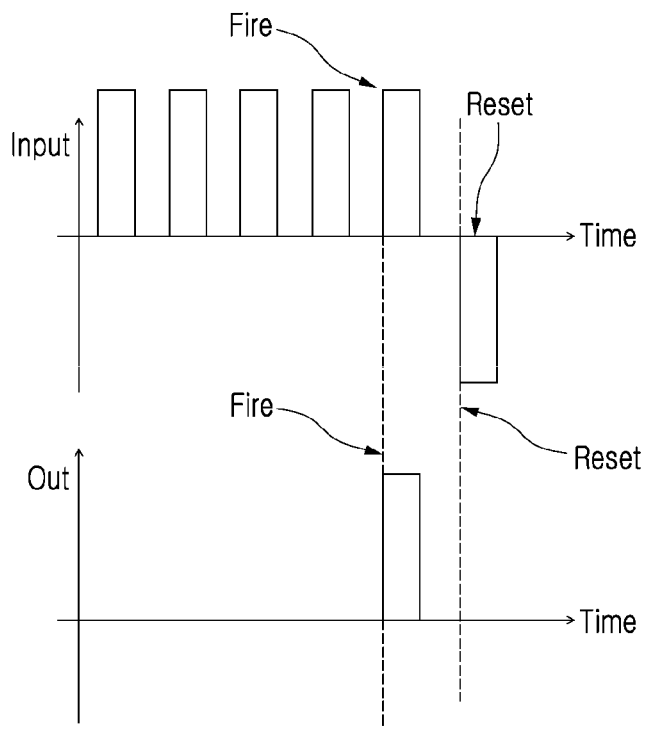
[FIG. 8]
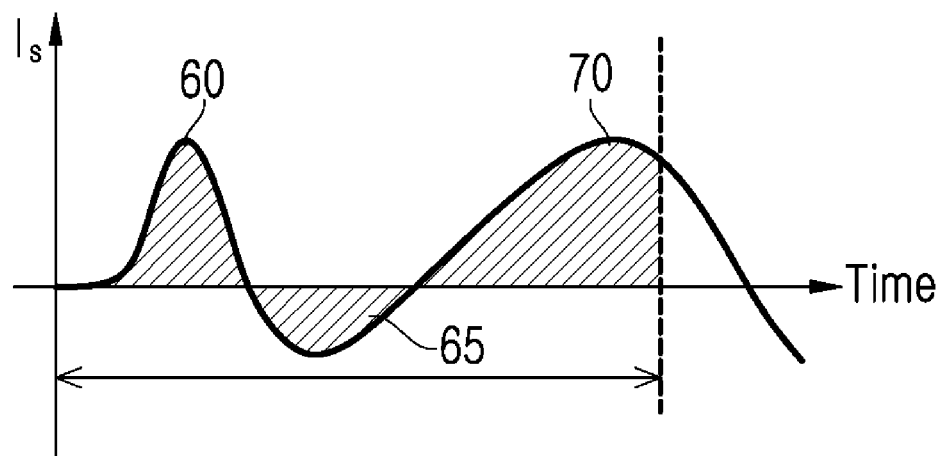

[FIG. 9]
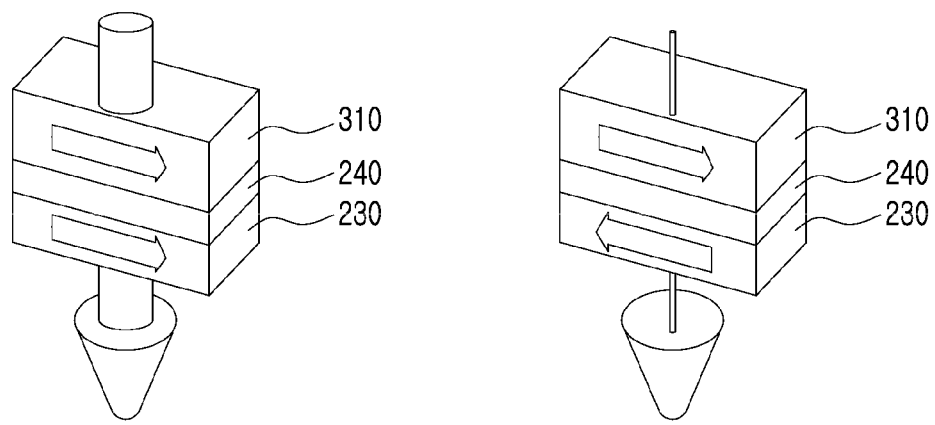
[FIG. 10]
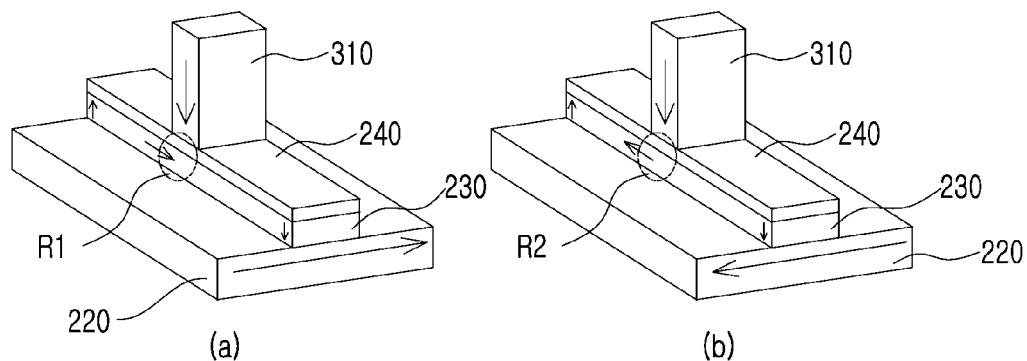

[FIG. 11]
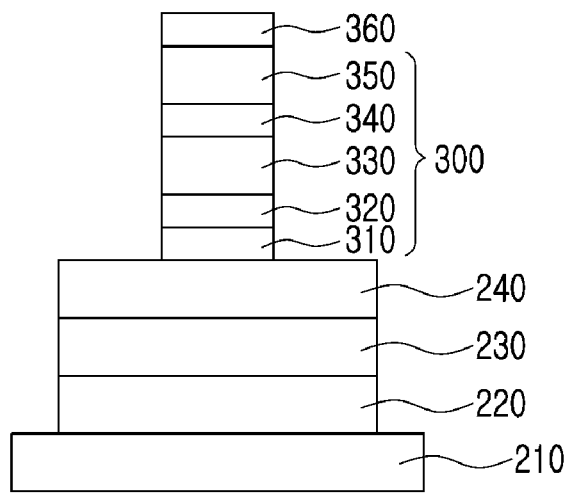
[FIG. 12]
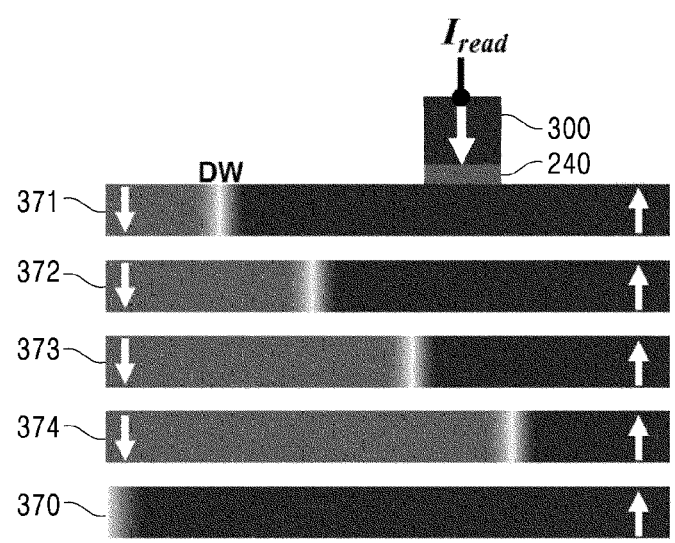

[FIG. 13]
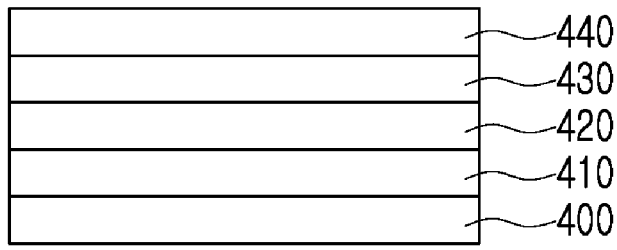
[FIG. 14]
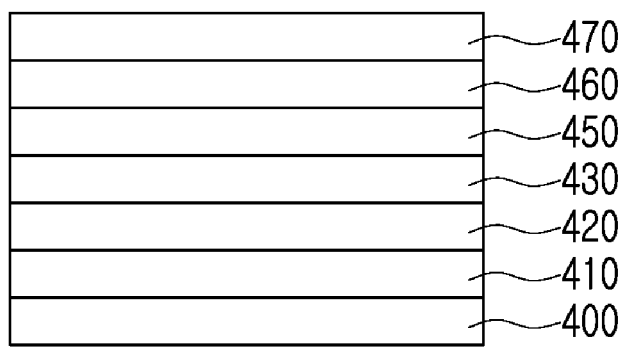
[FIG. 15]
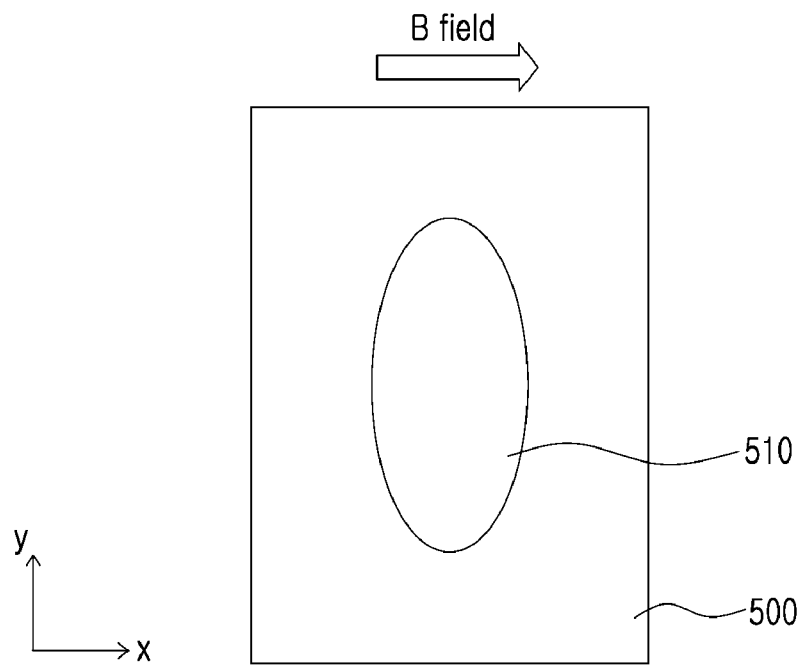

[FIG. 16]
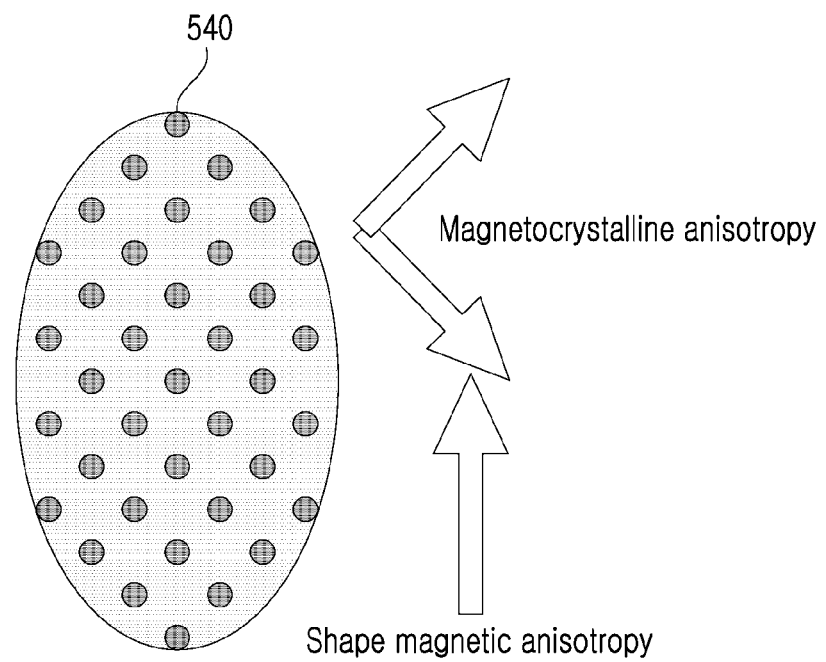
[FIG. 17]
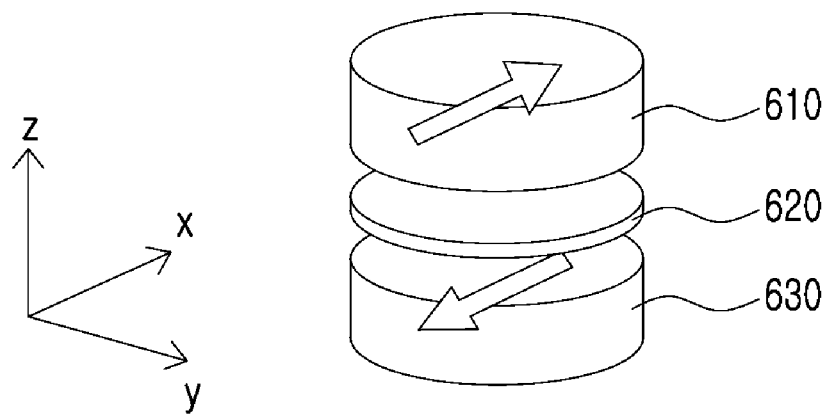

[FIG. 18]
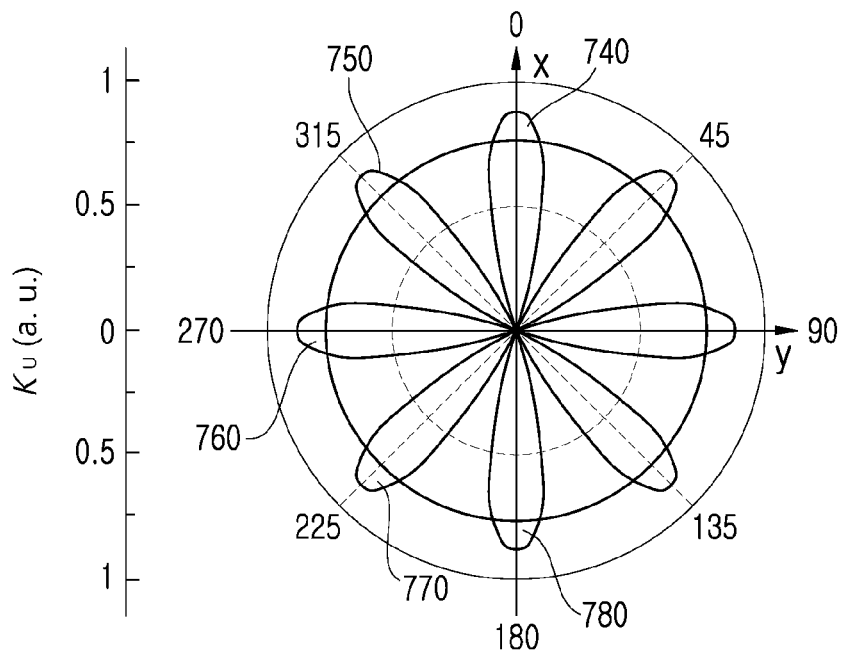
[FIG. 19]
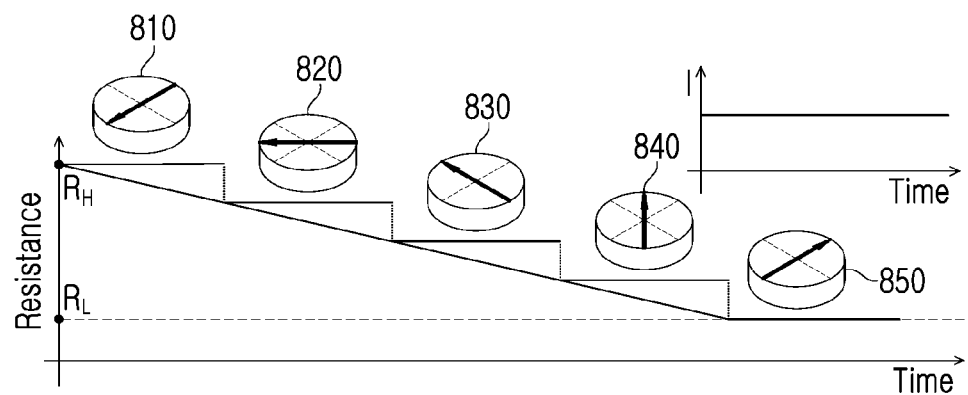

[FIG. 20]
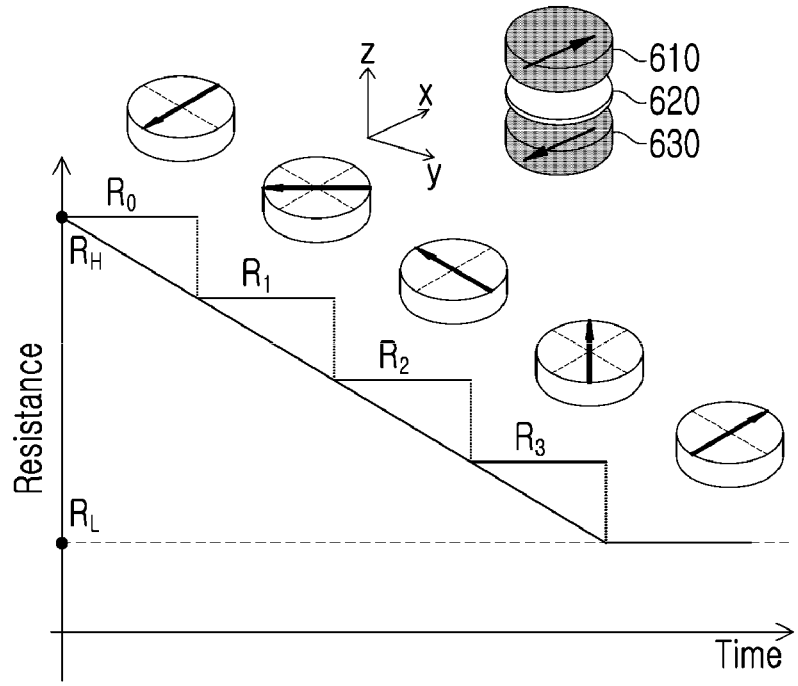
[FIG. 21]
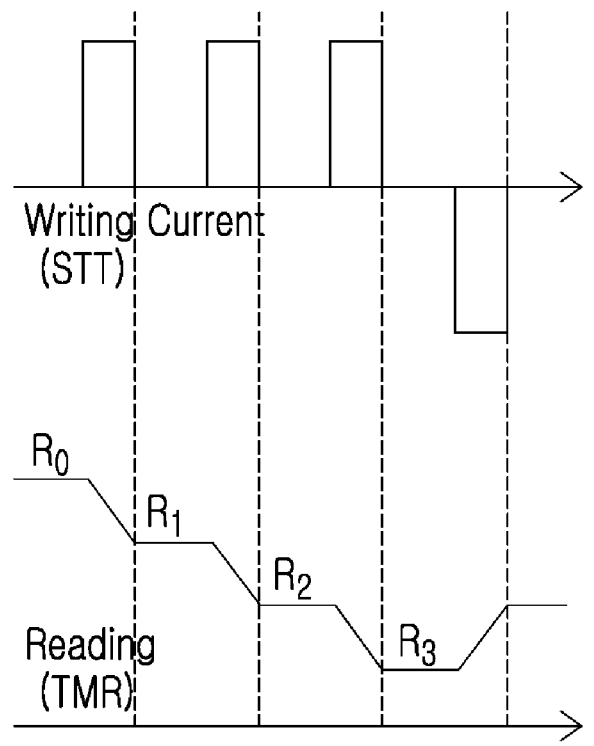

[FIG. 22]
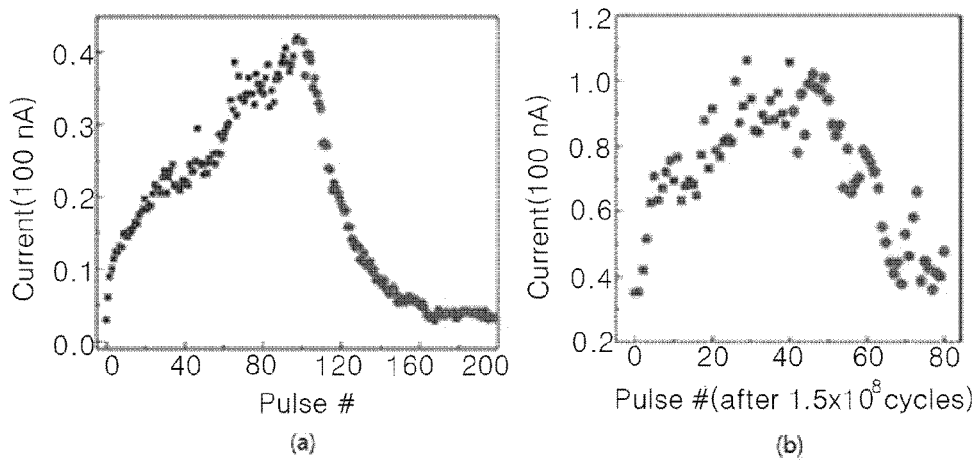
[FIG. 23]
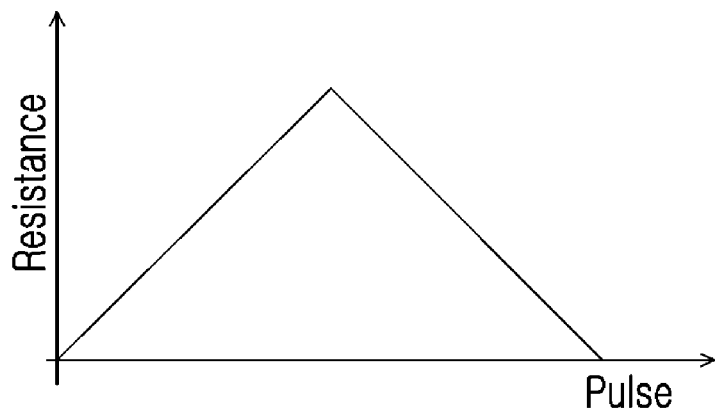
[FIG. 24]
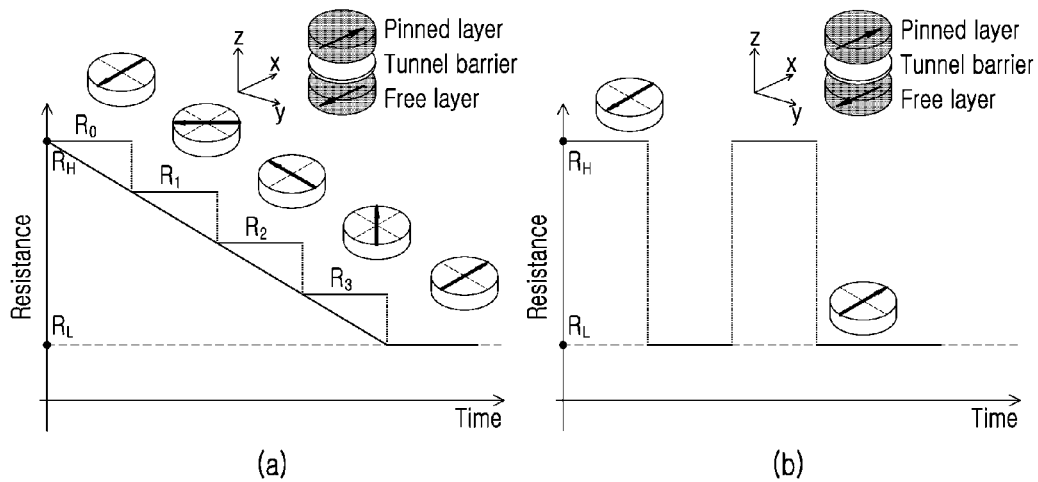

SPIN DEVICE, AND OPERATING METHOD THEREFOR AND MANUFACTURING METHOD THEREFOR

TECHNICAL FIELD

The present invention is related to structure, operating method, and manufacturing method of spin device, more particularly related to structure and operating method of spin device which can use the movement of a magnetic domain wall or can store multi-bits.

BACKGROUND ART

Among the many nonvolatile memories that have been recently proposed, there is a magnetoresistive random access memory (MRAM) using tunneling magnetoresistance (TMR) as a magnetic memory. Until now, the driving of the MRAM using the spin transfer torque (STT) has been performed by using the method of writing 0 and 1 using the resistance change according to the magnetization direction of the magnetic layer. MRAM is a memory that stores information in a memory cell in accordance with the magnetization state of a magnetoresistive element exhibiting a magnetoresistive effect.

Usually, a magnetoresistive element includes a free layer and a pinned layer. When the magnetization direction of the free layer and the pinned layer are parallel, a low resistance state appears. When the magnetization directions are opposite to each other, a high resistance state appears. Which can be used to store information.

Conventional MRAM devices have only two values, a high resistance state and a low resistance state. Meanwhile, in 2014, IBM manufactured a CMOS neuromorphic synapse and a CMOS neuron to show the possibility of realizing neuromorphic computer.

However, in order to realize synaptic behavior in an organism through a CMOS based device, weighting can be given, but conventional MRAM devices have a problem that it is difficult to implement.

Furthermore, when the size of the MRAM device is reduced by reducing the size of the magnetoresistive element, the coercive force (Hc) in the magnetoresistive element is increased, so that the current required for writing increases. For this reason, there is a problem that it is very difficult to drive a reduced cell with a low current for a large capacity of 256 Mbits or more.

In order to increase the storage density of the MRAM, it is necessary to reduce the size of the magnetic tunneling junction (MTJ) element. The problem is that when the width of the MTJ element is reduced to several tens of nanometers (nm) or less, the stray field generating at the pinned layer greatly increases, and may adversely affect switching characteristics (i.e., magnetization inversion) of the free layer. Therefore, a switching asymmetry of the free layer occurs, which may be a serious problem in the operation of the memory device (MRAM).

Furthermore, STT memory has relatively large power consumption, and is easily affected by the current required in the read operation, so that there is a stability problem. If the current is applied to the STT memory to read the resistance value of the magnetic layer, the magnetization direction is interfered by the current, and the resistance of the magnetic layer of the memory is read incorrectly.

Also, in the case of a CMOS synapse, the size of a device required to make one synapse element is large, and the process is complicated compared to other devices.

U.S. Pat. No. 9,070,455 discloses a memory including a nonmagnetic element and performing a storage function by movement of a magnetic wall due to a spin transfer torque (STT). However, when a memory using a STT is manufactured, there is a problem that integration of the device is limited due to high driving power.

U.S. Pat. No. 7,869,266 discloses a structure in which an insulating layer is formed between magnetic layers, and a device is controlled by using a spin orbit torque (SOT). In addition, this patent relates to current switching magnetic memory having a low current multi-stage, in which an MTJ is applied, and a magnetic memory uses a torque generated by an electron polarized spin. Such a device has a problem in that its fabrication structure is complicated and it is difficult to integrate the device.

U.S. Pat. No. 7,525,862 discloses a MRAM, in which two pillar structure appears, and bi-directional current is applied to one terminal to change the magnetic domain of the ferromagnetic layer to reset the magnetization state of the free layer from 1 to 0. And, this patent discloses a technique for improving driving characteristics of the MRAM. Further, the MRAM has multilayer structure, is a device whose domain is controlled by the STT, and use a barrier layer between the magnetic layers. In addition, this structure has a problem in that integration of the device is limited because the driving power is high due to STT operation.

European Patent Application No. 13290226.3 is a structure consisting of a MTJ comprising a material having high spin orbit coupling. Also, the MTJ has the storage layer, the barrier layer, and sensing layer. MRAM cell is self-referenced memory, and further comprises a seed layer having high spin orbit coupling. The seed layer has a material (Ta, Pt, Pd, and the like) that applies a SOT suitable for switching the sense magnetization of the sense layer. However, this is merely a memory that operates on/off according to the direction between the pinned layer and the free layer.

U.S. Patent Publication No. 2016/0172581 discloses spin torque majority device, in which a plurality of input elements, a spin mixing layer and a non-magnetic tunneling layer are consisted of. However, it is a memory device which is difficult to use as a structure using a magnetic wall.

In addition, biological synapses transmit pulse signals to excitement neuron or inhibitory neuron, and perform excitation operation or suppression operation according to pulse signal received from the neuron. In a conventional neuron/synapse circuit, a large number of capacitors and MOSFETs should be formed. Considering hundreds of millions of synapse arrays and neuron circuits, there is a problem that the neuron/synapse circuit occupies a large area and power consumption is greatly increased.

U.S. Patent Publication No. 2015/0137293 discloses a structure in which an insulating layer is formed between magnetic layers and the magnetic layer has a perpendicular or horizontal anisotropy. However, there is a problem that integration of device is difficult because of a complicated usage structure.

US Patent Publication No. 2014/0301135 discloses a device structure capable of recording data on an anisotropic recording layer by using STT. The STT-MRAM is composed of an MTJ, an insulating layer, and a reference layer. In STT-MRAM, the magnetization direction of the recording layer is switched along the anisotropic axis of the recording layer, which records the magnetization direction through the STT inducing the switching, so that the data is recorded in the recording layer. However, it is difficult to fabricate a low power device using a STT.

According to U.S. Pat. No. 9,373,781, the magnetic junction is a double magnetic junction structure configured such that when the write current flows through the magnetic junction, the free layer is switched between stable magnetic states. However, it is difficult to fabricate a device using a STT with a low power and high integration device.

DISCLOSURE

Technical Problem

A first aspect of the present invention is to provide a spin device in which a magnetic domain wall is controlled by a spin orbital torque (SOT).

In addition, a second aspect of the present invention is to provide a method of operating the spin device for achieving the first aspect of the present invention.

In addition, a third aspect of the present invention is to provide a spin synapse device capable of multi-bit storage.

In addition, a fourth aspect of the present invention is to provide a method of manufacturing a spin synapse device for achieving the fourth aspect of present invention.

In addition, a fifth aspect of the present invention is to provide an operation method of a spin synapse device for achieving the fourth aspect of the present invention.

Technical Solution

One aspect of the present invention provides a spin device comprising an electrode formed on a substrate, a free layer formed on the electrode and generating a magnetic domain wall movement in accordance with a spin orbit torque, a tunnel barrier layer formed on the free layer and being made of non-magnetic material, and a pinned domain layer disposed on the tunnel barrier layer and having fixed magnetization direction.

Second aspect of the present invention provides a method of operating a spin device having an electrode disposed on a substrate, a free layer disposed on the electrode and capable of moving a domain wall, a tunnel barrier layer formed on the free layer, and a pinned domain layer formed on the tunnel barrier layer, comprising applying a current pulse to the electrode in a direction parallel to the surface of the electrode, moving the domain wall of the free wall due to the current pulse, and changing magnetoresistance of the spin device by movement of the magnetic domain wall of the free layer.

Third aspect of the present invention provides a spin synapse device comprising, substrate, a first electrode formed on the substrate, a pinned layer formed on the first electrode, a tunnel barrier layer formed on the pinned layer, a free layer formed on the tunnel barrier layer and having multiaxial magnetic anisotropy, and a second electrode formed on the free layer.

Fourth aspect of the present invention provides a method of manufacturing a spin synapse device, comprising, forming a first electrode on a substrate, disposing ferromagnetic materials on a side of the substrate spaced apart from the substrate and arranging the ferromagnetic materials so as to face each other with different poles, forming a free layer on the electrode, magnetizing the free layer in a first direction by using the ferromagnetic materials during the forming the free layer, heating the free layer to being magnetized, applying a magnetic field so that the free layer is magnetized in a second direction different from the first direction while the heating is maintained, forming a tunnel barrier layer on the free layer, forming a pinned layer on the tunnel barrier layer, and forming a second electrode on the pinned layer.

Fifth aspect of the present invention provides a method of operating a spin synapse device having a first electrode, a pinned layer formed on the first electrode, a tunnel barrier layer formed on the pinned layer, a free layer formed on the tunnel barrier layer, and a second electrode formed on the free layer, comprising, applying current pulse to the first electrode, changing magnetization direction of the free layer due to the current pulse, and accumulating the change of the magnetization direction of the free layer according to accumulation of the current pulse, wherein magnetoresistance of the spin synapse device is minimized when the magnetization direction of the free layer due to accumulation of the change of the magnetization direction is in the same direction as magnetization direction of the pinned layer.

Advantageous Effects

According to the present invention described above, there is an effect that the magnetization inversion of the free layer can be reversed with a lower current than the magnetic device using the spin transfer torque.

In addition, since the structure of the device is simpler than that of the conventional CMOS, it is easy to fabricate, and a nonvolatile memory with low power consumption and high integration can be manufactured.

In addition, since it is possible to manufacture a low-power memory by a simple process, it is easy to apply to a highly integrated neurocomputer device.

In addition, a multi-bit MTJ can be realized by applying free layer having multiaxial magnetic anisotropy. Since the magnitude of the magnetoresistance can be adjusted according to the angle of the pinned layer and the free layer, the multi-bit application is easy and the artificial synapse technology can be applied.

DESCRIPTION OF DRAWINGS

FIG. 1 is a cross-sectional view of a spin device driven by using a spin orbital torque (SOT) according to a preferred embodiment of the present invention.

FIG. 2 is a schematic view showing a state of a magnetic domain wall moved according to a current applied to a spin device according to a preferred embodiment of the present invention.

FIG. 3 is a schematic diagram showing a magnetic domain wall movement state of a free layer as a pulse signal is accumulated or converted according to a preferred embodiment of the present invention.

FIG. 4 is a graph illustrating a change of magnetoresistance due to movement of a magnetic domain wall as application of a pulse according to a preferred embodiment of the present invention.

FIG. 5 is a graph illustrating two operations of a Long-Term Potentiation (LTP) and a Long-Term Depression (LTD) according to a preferred embodiment of the present invention.

FIG. 6 is a conceptual diagram of a basic principle of neuron or synapse operation of using a spin device according to a preferred embodiment of the present invention.

FIG. 7 is a graph illustrating the operation of a neuron spin device according to a pulse signal according to a preferred embodiment of the present invention.

FIG. 8 is a graph of an input signal according to a preferred embodiment of the present invention.

FIG. 9 is a schematic diagram showing magnetoresistance of a free layer and a pinned layer according to a spin direction according to a preferred embodiment of the present invention.

FIG. 10 is a schematic view showing movement of a magnetic domain wall according to a current direction at an electrode according to a preferred embodiment of the present invention.

FIG. 11 is a cross-sectional view of a neuron spin device according to a preferred embodiment of the present invention.

FIG. 12 is a schematic view showing movement of a magnetic domain wall of a free layer according to a pulse current at an electrode according to a preferred embodiment of the present invention.

FIG. 13 is a cross-sectional view of a spin synapse device forming a magnetic tunnel junction (MTJ) with a first free layer, a first tunnel barrier layer, and a first pinned layer according to a modified embodiment of the present invention.

FIG. 14 is a cross-sectional view of a spin synapse device forming a magnetic tunnel junction (MTJ) with a first free layer, a first tunnel junction layer, a first pinned layer, a second tunnel junction layer and a second free layer according to a modified embodiment of the present invention.

FIG. 15 is a schematic view of a method of forming a first free layer having multiaxial magnetic anisotropy according to a modified embodiment of the present invention.

FIG. 16 is a schematic view of anisotropic structure of a free layer having multiaxial magnetic anisotropy according to a modified embodiment of the present invention.

FIG. 17 is a detached perspective view showing basic structure of a spin synapse device having a free layer, a tunnel barrier layer, and a pinned layer formed according to a modified embodiment of the present invention.

FIG. 18 is a graph showing the formation of the spin direction of the free layer according to the modified embodiment of the present invention at intervals of 45°.

FIG. 19 is a schematic diagram illustrating a spin direction conversion by applying a current pulse to a spin synapse device while maintaining a current level of a spin synapse device according to a modified embodiment of the present invention.

FIG. 20 is a graph showing a quantitative change in magnetoresistance of a spin synapse device by applying a current pulse to a spin synapse device according to a modified embodiment of the present invention.

FIG. 21 is a schematic diagram for reading a magnetoresistance and writing a spin synapse device at which a current pulse is applied according to a modified embodiment of the present invention.

FIG. 22 is a predictive graph of excitation and suppression for a spin synapse device according to a modified embodiment of the present invention.

FIG. 23 is a schematic diagram for excitation and suppression of a spin synapse device according to a modified embodiment of the present invention.

FIG. 24 is a graph showing a comparison between a spin synapse device and a STT-MRAM according to a modified embodiment of the present invention.

MODES OF THE INVENTION

Hereinafter, embodiments of the present invention will be described in detail with reference to the accompanying drawings.

While the present invention is susceptible to various modifications and alternative forms, specific embodiments thereof are shown by way of example in the drawings and will herein be described in detail. However, it should be understood that there is no intent to limit the invention to the particular forms disclosed but rather the invention is to cover all modifications, equivalents, and alternatives falling within the spirit and scope of the invention defined by the appended claims.

When an element such as a layer, a region, and a substrate is referred to as being disposed "on" another element, it should be understood that the element may be directly formed on the other element or an intervening element may be interposed therebetween.

It should be understood that, although the terms "first," "second," etc. may be used herein to describe various elements, components, areas, layers, and/or regions, these elements, components, areas, layers, and/or regions are not limited by these terms.

Embodiment

The present invention discloses a neuron device and synapse device for application to a neuromorphic computer and the like, and neuromorphic device using movement of magnetic domain wall by spin orbit torque so that synaptic operation or neuron operation similar to living organisms is implemented.

Generally, when a CMOS synapse device or a CMOS neuron device is fabricated, the size of the CMOS synapse device or the CMOS neuron device is large, integration is difficult, and the manufacturing process is complicated, resulting in a high production cost. The best way to solve such a problem is to use a spin orbit torque (SOT) and to manufacture a device capable of controlling the magnetic domain wall by using the SOT.

FIG. 1 is a cross-sectional view of a spin device driven by using a spin orbital torque (SOT) according to a preferred embodiment of the present invention.

Referring to FIG. 1, an electrode 110 is formed on a substrate 100. The electrode 110 is made of a heavy metal and a free layer 120 is formed on the electrode 110, and a tunnel barrier layer 130 is formed on the free layer 120. A pinned domain layer 140 is formed on the tunnel barrier layer 130, and includes first pinned layer 141, a spacer layer 142 formed on the first pinned layer 141, and second pinned layer 143 formed on the spacer layer 142.

When a current is applied to the electrode 110 in a direction parallel to the surface of electrode 110 that is composed of a heavy metal and is disposed directly below the free layer 120, the spin orbit torque occurs spin polarization due to the Rashba effect or the spin hall effect. As a result, spin pumping occurs in the free layer 120 and a spin current flows. This spin current causes magnetization inversion of the free layer 120. In this case, since the current is not directly applied to the free layer 120, the current consumption is low. In addition, since the write line and the read line are separated from each other in the memory using the SOT, the stability of the device operation can be easily ensured.

If CMOS synapses are manufactured, multiple gates and channels should be designed, and the size of a CMOS synapse becomes larger. But synapse device based on SOT can be manufactured with a smaller size because of using a single device. It is easy to fabricate because the structure of the device using the SOT that can perform the magnetization reversal with the lower current than the conventional STT is simpler than the conventional CMOS.

The electrode 110 is non-magnetic metal composed of Ta and the like, and can generate SOT. The SOT is generated by the accumulation of spin-polarized electrons at the interface between the electrode 110 and the free layer 120. The polarization direction is not determined by the direction of external magnetic field, but is determined by the current direction.

The free layer 120 can move the magnetic domain wall by the current at the electrode 110 that is in contact with the free layer 120. The material used for the free layer 120 is CoFeB, Co/Ni, Co/Pd, CoFe or Co.

The material used for the tunnel barrier layer 130 is an oxide, and MgO or AlOx is mainly used as the oxide.

The first pinned layer 141 and the second pinned layer 143 may be made of any one of Co, Fe, Pd, Ni, Mn, Fe, Co, Ni, Cr, permalloy, heusler alloy and GaMnAs.

The second pinned layer 143 is provided to prevent the magnetization direction at the first pinned layer 141 from being changed when the magnetic domain wall is moved. That is, the second pinned layer 143 has the same magnetization direction as the first pinned layer 141, and prevents the magnetization of the first pinned layer 141 from being affected by the movement of the magnetic domain wall or the change of magnetization of the free layer 120.

The spacer layer 142 is a non-magnetic layer, and is mainly made of Ta, Ru, or Cu.

FIG. 2 is a schematic view showing a state of a magnetic domain wall moved according to a current applied to a spin device according to a preferred embodiment of the present invention.

Referring to (a), (b) and (c) of FIG. 2, current flows the electrode 110 in a parallel direction to the surface of electrode 110.

In (a) of FIG. 2, current pulse is continuously applied in parallel direction to the surface of electrode 110 so that the magnetic domain wall in the free layer 120 can be maximally moved.

In addition, since the magnetization direction of the pinned domain layer 140 and the main magnetization direction of the free layer 120 are opposite to each other, the magnetoresistance in the vertical direction of the spin device can be a high value or a maximum value.

In (b) of FIG. 2, the magnetic domain of the free layer 120 is controlled by current flowing the electrode 110 regardless of the direction of the applied external magnetic field, so that the ratio of the magnetic domains having different spin direction from each other is an equal state at the free layer 120. Since the magnetic domain wall of the free layer 120, which is the same as the magnetization direction of the first pinned layer 141 of the pinned domain layer 140, occupies half of the free layer 120, the magnetoresistance in the vertical direction of the spin device has about half value with respect to maximum magnetoresistance.

In (c) of FIG. 2, current pulse is continuously applied to the electrode 110 having a heavy metal so that the magnetic domain wall in the free layer 120 can be maximally moved. In addition, since the magnetization direction of the pinned domain layer 140 and the main magnetization direction of the free layer 120 are the same, the magnetoresistance in the vertical direction of the spin device can be a low value or a minimum value.

So, the area or movement of the magnetic domain wall with same spin direction in the free layer 120 can be controlled by current pulse applied to the electrode 110 in a parallel direction with surface of the electrode 110.

FIG. 3 is a schematic diagram showing a magnetic domain wall movement state of a free layer as a pulse signal is accumulated or converted according to a preferred embodiment of the present invention.

Referring to FIG. 3, (a) shows the progress of the current pulse, and (b) shows the movement of the free layer 120 due to the progress of the current pulse.

The first current pulse flows in the electrode 110, and the current direction is set so as to flow in a direction toward the surface of the electrode 110. Since the magnetization direction of the main region of the free layer 120 and the magnetization direction of the pinned domain layer 140 are opposite to each other, the magnetoresistance in the vertical direction of the spin device can show a high value.

Then, the second current pulse is applied, and since the free layer 120 has magnetic domains having magnetization directions opposite to each other, and the sizes of magnetic domains are equal to each other, so that the magnetoresistance of the free layer 120 becomes smaller than that of the spin device at the first current pulse.

Then, the third current pulse is applied, and the magnetic domain wall of the free layer 120 moves, and the domain wall in the same direction as the magnetization direction of the pinned domain layer 140 increases. Therefore, the magnetoresistance of the spin device is reduced as compared with the case where the second current pulse is applied.

Next, the fourth current pulse having inverted phase relative to the third current pulse is applied, and the magnetic domain wall in the free layer 120 moves in the opposite direction unlike the case where the third current pulse is applied, so that the magnetic domain wall of the free layer 110 becomes the same state as when the second current pulse is applied.

Subsequently, when the fifth current pulse is applied, the magnetic domain wall in the free layer 120 is further moved to increase the magnetic domain opposite to the magnetization state of the pinned domain layer 140, and the magnetoresistance of the spin device is increased to the same state as when the first pulse is applied.

In case of the movement of the magnetic domain wall using the SOT, the magnetic domain wall moves in a direction perpendicular to the direction in which the current flows. The current required for movement of the magnetic domain wall due to the SOT is about 10% of the current required for movement of the magnetic domain wall due to the STT.

FIG. 4 is a graph illustrating a change of magnetoresistance due to movement of a magnetic domain wall as application of a current pulse according to a preferred embodiment of the present invention.

Referring to FIG. 4, the initial state of the spin device is a state in which the magnetization direction of the free layer 120 is the same as the magnetization direction of the pinned domain layer 140, and the magnetoresistance of the spin device is minimum. When the magnetization direction of the free layer 120 of the spin device is in the same state as the magnetization direction of the pinned domain layer 140, the magnetoresistance in the vertical direction of the spin device can be minimized.

By applying a current pulse stepwise to the spin device, a SOT is generated due to the current flowing to the electrode 100, and the magnetic domain wall in the free layer 120 is moved. In the initial state of the spin device, a reverse current pulse such as the fourth current pulse of FIG. 3 is applied to move the magnetic domain wall of the free layer 120. The magnetoresistance of the spin device increases with the increase of the magnetic domain having the magnetization direction opposite to the magnetization direction of the pinned domain layer 140. The magnetic domain wall is further moved due to the applied reverse current pulse and the magnetic domain having the magnetization direction opposite to the magnetization direction of the pinned domain layer 140 becomes the maximum, so that the magnetoresistance of the spin device becomes maximum.

Subsequently, the current pulse such as the first current pulse of FIG. 3 is applied to change the moving direction of the magnetic domain wall. The magnetic domain of the free layer 120 having the magnetization direction in the same direction as the magnetization direction of the pinned domain layer 140 is increased by the movement of the magnetic domain wall and the magnetoresistance of the spin device is decreased.

Subsequently, when the current pulse is further applied, the magnetic domain having the magnetization direction in the same direction as the magnetization direction of the pinned domain layer 140 is maximized due to the subsequent migration of the magnetic domain wall, and the magnetoresistance of the spin device is minimized.

That is, the magnetoresistance value of the spin device can be adjusted by changing the magnetic domain having the same magnetization direction as the magnetization direction of the pinned domain layer 140 due to the magnetic domain wall movement of the free layer 120, and the magnetic domain wall of the free layer 120 moves according to the progress of the current pulse. So, the magnetoresistance of the spin device can be controlled in steps.

FIG. 5 is a graph illustrating two operations of a Long-Term Potentiation (LTP) and a Long-Term Depression (LTD) according to a preferred embodiment of the present invention.

Referring to FIG. 5, biological synapses perform two operations that are Long-Term Potentiation (LTP) and Long-Term Depression (LTD). LTP means that the signal transmission between the neurons is gradually improved when a synapse between two neurons is stimulated with a long cycle. This means that the signaling ability of the synapse is improved. LTD, on the contrary, means that signaling between neurons is getting weaker. The controlling of the improvement and weakening of the signal transmission is defined as controlling weight of the synapse. It can be seen that the operation of the biological synapse is similar to the adjustment of the magnetoresistance according to the movement of the magnetic domain wall in FIG. 4.

In the present invention, in the case of the spin synapse, it can be implemented in a similar manner by changing the magnetoresistance through the magnetic domain wall movement as in the operation of LTP and LTD of the biological synapse.

Production Example 1

For experimental investigation, the spin device is fabricated with the following structure. Si is used as a substrate, and $SiO_2$ is formed to a thickness of 120 nm on Si substrate. Subsequently, Ta is formed to thickness of 2 nm as the electrode 110, and then the free layer 120 is formed of $Co_{0.4}Fe_{0.55}B_{0.05}$ on the electrode 110.

Further, MgO is formed to thickness of 2 nm as the tunnel barrier layer 130 sequentially on the free layer 120, and Fe is formed to a thickness of 4 nm as the first pinned layer 141 on the tunnel barrier layer 130.

Evaluation Example 1

The spin device manufactured in Production Example 1 is evaluated. Current pulse is applied to the electrode 110 in the horizontal direction with surface. The magnetic domain wall in the free layer 120 is moved according to the current pulse, and the direction of movement of the domain wall is perpendicular to the current flow. Current pulse is applied to change the current flowing to the electrode 110 in the range of the current density of 5.06 $A/cm^2$ to 6.46 $A/cm^2$.

When the current pulse is continuously applied in the same phase, the magnetic domain wall of the free layer 120 moves in one direction, and the spin directions of the free layer 120 are all the same. At this time, the magnetization direction of the free layer 120 is the same as the magnetization direction of the first pinning layer 141, and the magnetoresistance value of the spin device reached a minimum value.

The spin device that can control domain wall movement by using SOT phenomenon can be applied to artificial neural network devices (ANN devices).

The magnetic domain wall is easy to determine whether or not the neuron device have accumulated stimulus.

In the case of the structure proposed in the present invention, signal processing can be performed when a signal exceeding a threshold value is input due to accumulation of a current pulse (stimulus).

There are various methods for moving a magnetic domain wall. Movement through an external magnetic field has been reported, and movement of the magnetic wall has also been reported through STT. Particularly, recently, the movement of the magnetic domain wall using the SOT has been reported. It shows a great advantage compared to the case of using the STT when the magnetic domain wall is moved by using the SOT. When the magnetic domain wall is moved by using the SOT, the operation power of the neuron spin device is reduced and the driving speed is increased.

According to the some paper ("Domain Wall Motion Orthogonal to Current Flow Due To Spin Orbit, Torque", Scientific Reports, 2015 by Debanjan Bhowmik), when using SOT, write latency is 100 times faster than STT, and write current is about 10 times smaller than that of STT.

In addition, when STT is used, a pinned layer for spin polarization is required. However, when a SOT is used, an additional pinned layer for spin polarization is not required, which is advantageous in simplifying the structure of the spin device.

FIG. 6 is a conceptual diagram of a basic principle of neuron or synapse operation of using a spin device according to a preferred embodiment of the present invention.

Referring to FIG. 6, a neuron outputs a specific signal when a sum of signals accumulated from synapses exceeds a threshold value. The initial signal due to the object 10 is input to the neuron 20 and the signal is continuously input to the neuron 20, then signal is accumulated in the synapse 40 between the neuron 20 and the neuron 30. When the signal is accumulated in the synapse 40 and exceeds the threshold value, the signal is transmitted to the next neuron 30, and the signal is accumulated in the synapse 50 connected to the neuron 30. When the signal is accumulated on the synapse and signals accumulated at the synapse exceeds the threshold value, the signal is transmitted to the next synapse of the next neuron, and final recognition (reading or writing) becomes possible.

The neuron spin device of the present invention is a device capable of highly integrating with low power consumption and capable of reproducing a biological synapse function completely. Since there is no interference between the devices, the reliability of the synapse output is very high.

FIG. 7 is a graph illustrating the operation of a neuron spin device according to a pulse signal according to a preferred embodiment of the present invention.

Referring to FIG. 7, the pulse signal is inputted to the neuron spin device, and the output signal of the neuron spin device does not appear before the pulse signal reaches the threshold value. When the pulse signal reaches the threshold value, the input signal at this time is referred to as a fire pulse, and the output signal of the neuron spin device at the fire pulse is generated and outputted. Subsequently, a reverse pulse signal (reset signal) is inputted, and the output signal of the neuron spin device becomes zero.

FIG. 8 is a graph of an input signal according to a preferred embodiment of the present invention.

Referring to FIG. 8, if the total sum of the signals accumulated in the neuron spin device does not exceed the threshold value, the signal is not transferred. The initial accumulated value 60 cannot exceed the threshold value, and it can be confirmed that the neuron spin device is reset by reverse input signal 65. Then, an output signal of the neuron spin device is generated by input signal 70 accumulated after reset. That is, when the integrated value of the input current Is becomes equal to or greater than the threshold value, the neuron spin device is turned on.

FIG. 9 is a schematic diagram showing magnetoresistance of a free layer and a pinned layer according to a spin direction according to a preferred embodiment of the present invention.

Referring to FIG. 9, a neuron spin device has a free layer 230, a tunnel barrier layer 240, and a pinned layer 310.

The pinned layer 310 has its magnetization fixed and the magnetization of the free layer 230 can be changed according to the external magnetic field generated by the programming current.

When the spin direction of the free layer 230 is the same as the spin direction of the pinned layer 310, the maximum current can flow in the vertical direction of the neuron spin device, and the magnetoresistance of the neuron spin device becomes the minimum state.

When the spin direction of the free layer 230 is 180° different from the spin direction of the pinned layer 310, the minimum current can flow in the vertical direction of the neuron spin device, and the magnetoresistance becomes the maximum state.

That is, the magnetoresistance is determined according to the magnetic directions of the pinned layer 310 and the free layer 230, which are two adjacent magnetic layers.

FIG. 10 is a schematic view showing movement of a magnetic domain wall according to a current direction at an electrode according to a preferred embodiment of the present invention.

Referring to (a) and (b) of FIG. 10, it can be seen that the direction of movement of the magnetic domain walls is changed according to the direction of the current pulse in the electrode 220.

That is, in the case of (a), the magnetic domain wall moves to the right due to the applied current pulse, and the corresponding region R1 of the free layer 230 is opposite to the spin direction of the pinned layer 310 through the movement of the magnetic domain wall. Therefore, the magnetoresistance of the neuron spin device becomes the maximum state.

In the case of (b), the current pulse is opposite to the direction set in (a), so that the magnetic domain wall is opposite to the moving direction of (a). Therefore, the magnetic domains having the same spin direction as the spin direction of the pinned layer 310 are enlarged. Therefore, since the spin direction of the corresponding region R2 of the free layer 230 is the same as the spin direction of the pinned layer 310, the magnetoresistance of the neuron spin device is minimized.

FIG. 11 is a cross-sectional view of a neuron spin device according to a preferred embodiment of the present invention.

Referring to FIG. 11, the neuron spin device of this embodiment includes an electrode 220 disposed on a substrate 210, a free layer 230 disposed on the electrode 220 and capable of moving a domain wall, A tunnel barrier layer 240 disposed on the free layer 230, a pinned domain layer 300 formed on the tunnel barrier layer 240, and a capping layer 360 formed on the pinned domain layer 300.

The pinned domain layer 300 also includes a pinned layer 310 disposed on the tunnel barrier layer 240, a first non-magnetic layer 320 disposed on the pinned layer 310, a first multi-layer 330 disposed on the first non-magnetic layer 320, a second non-magnetic layer 340 disposed on the first multi-layer 330, and a second multi-layer 350 disposed on the second non-magnetic layer 340.

The free layer 230 performs movement of the magnetic domain wall in accordance with the current flowing through the electrode 220 in a parallel direction to surface. Accordingly, the magnetization direction of the free layer 230 under the pinned domain layer 300 is determined according to the movement of the magnetic domain wall in the free layer 230, and the resistance of the neuron spin device is also determined.

The pinned layer 310, the first multi-layer 330, and the second multi-layer 350 represent fixed magnetization directions, and when the magnetization vectors are all summed, the magnetization direction faces the substrate 210, but is not limited thereto.

FIG. 12 is a schematic view showing movement of a magnetic domain wall of a free layer according to a current pulse at an electrode according to a preferred embodiment of the present invention.

Referring to FIG. 12, when a current pulse flows in parallel with the electrode in the reset state 370, the magnetic domain wall of the free layer of the neuron spin device moves. As the current pulse is applied, the magnetic domain wall moves to proceed cumulative progression 1(371), cumulative progression 2(372), and cumulative progression 3(373). Then, when a current pulse is added, the magnetic domain wall moves. When the magnetic domain of the free layer 230 coinciding with magnetization direction of the pinned domain layer 300 is generated at the corresponding region under the pinned domain layer 300 as the magnetic domain wall moves, an output is generated by fire operation. When the inverse signal of the current pulse is applied after the output of the neuron spin device is generated, the neuron spin device is reset (370).

Production Example 2

The neuron spin device as shown in FIG. 11 is manufactured. In the neuron spin device, a first non-magnetic layer 320 is formed between the pinned layer 310 and the first multi-layer 330, and a second non-magnetic layer 340 is formed between the first multi-layer 330 and the second multi-layer 350. The pinned layer 310 is disposed on the tunnel barrier layer 240.

The first multi-layer 330 and the second multi-layer 350 are each formed by alternately stacking Pd and Co, and the number of layers of the first multi-layer 330 is smaller than that of the second multi-layer 350.

Si is prepared as a substrate 210 and tungsten (W) is formed to a thickness of 10 nm on the substrate 210 as an electrode 220. Then, the free layer 230 is formed to thickness of 5 nm with CoFeB. On the free layer 230, MgO is formed to 3 nm thickness as the tunnel barrier layer 240.

Furthermore, Ta is formed to a thickness of 3 nm for the first non-magnetic layer 320, and Ru is formed to a thickness of 3 nm for the second non-magnetic layer 340. At the time of manufacturing the first multi-layer 330 and the second multi-layer 350, the Pd layer is deposited to a thickness of 0.4 nm to 0.8 nm. The Pd layer is deposited to induce vertical magnetization of the first multi-layer 330 and the second multi-layer 350.

The pinned layer 310 is formed using CoFeB as the same material as the free layer 230, and is formed to a thickness of 3 nm.

The first non-magnetic layer 320, the first multi-layer 330, the second non-magnetic layer 340, the second multi-layer 350, and the capping layer 360 formed on the tunnel barrier layer 240 by using a thin film process occupy a certain area on the tunnel barrier layer 240 and are arranged to be in a range of 10% to 50% of the long axis length of the electrode 220 in the long axis direction.

Evaluation Example 2

The neuron spin device fabricated in Production Example 2 is evaluated by using a current pulse.

A current pulse is applied to the electrode 220, and the current pulse is accumulated, and the firer operation (374) of FIG. 12 is generated when the accumulated current pulse exceeded the threshold value. At this time, the maximum current value is measured in the vertical direction of the neuron spin device, and then the reverse current pulse of the current pulse is applied to reset operation (370) to measure the minimum current in the vertical direction of the neuron spin device.

Modified Embodiment

Also, in the MTJ for memory application, the free layer has uniaxial magnetic anisotropy, and the spin direction of the free layer is in a state where only the angle formed with the spin direction of the pinned layer is 0° or 180°.

However, in the modification of embodiment of the present invention, the free layer is made to have multiaxial magnetic anisotropy, and the angle at which the spin direction of the free layer forms with the spin direction of the pinned layer can have a multi-step angle.

Furthermore, in a modified embodiment of the present invention, the spin direction can be interpreted to have the same meaning as the magnetization direction of the magnetic layer or the magnetic material.

FIG. 13 is a cross-sectional view of a spin synapse device forming a magnetic tunnel junction (MTJ) with a first free layer, a first tunnel barrier layer, and a first pinned layer according to a modified embodiment of the present invention.

Referring to FIG. 13, the spin synapse device has a pinned layer 410 formed on a first electrode 400, a first tunnel barrier layer 420 formed on the pinned layer 410, a first free layer 430 formed on the first tunnel barrier layer 420, and a second electrode 440 formed on the first free layer 430.

The pinned layer 410 may be a ferromagnetic material, such as Co, Fe, Ni, Mn, or an alloy thereof. For example, such alloys include CoFeB, NiFe, CoPt, CoPd, FePt, or FePd. The magnetization orientation of the pinned layer 410 is fixed and the magnetization of the first free layer 430 can be changed according to the external magnetic field generated by the programming current.

In addition, the first free layer 430 may be a ferromagnetic material, and may be Co, Fe, Ni, Mn, or an alloy thereof.

In addition, the first tunnel barrier layer 420 is a metal oxide, for example, MgOx, AlOx, or the like can be used.

The spin direction of the pinned layer 410 is fixed and the spin direction of the first free layer 430 generates a torque at a predetermined angle on the same plane in accordance with the current pulse applied to the spin synapse device through the first electrode 400.

The magnetoresistance of the spin synapse device changes according to angle formed by the spin direction of the first free layer 430 and the spin direction of the pinned layer 410.

FIG. 14 is a cross-sectional view of a spin synapse device forming a magnetic tunnel junction (MTJ) with a first free layer, a first tunnel junction layer, a first pinned layer, a second tunnel junction layer and a second free layer according to a modified embodiment of the present invention.

Referring to FIG. 14, spin synapse device has a structure in which a first free layer 430 and a second free layer 460, and MTJs exist in two regions.

The spin synapse device has a first electrode 400, a pinned layer 410, a first tunnel barrier layer 420, a first free layer 430, a second tunnel barrier layer 450, a second free layer 460, and a second electrode 470.

In addition, the second free layer 460 is a ferromagnetic material, and may be Co, Fe, Ni, Mn, or an alloy thereof.

The second tunnel barrier layer 450 is a metal oxide, for example, MgOx or AlOx.

The spin direction of the pinned layer 410 is fixed and the spin direction of the first free layer 430 having predetermined angle with the pinned layer 410 generates torque according to pulse current applied to the first electrode 400. The spin direction of the second free layer 460 also generates a spin torque according to the current pulse to form a certain angle with the spin direction of the second free layer 460 and the spin direction of the pinned layer 410. In addition, a second electrode 470 is formed on the second free layer 460.

The magnetoresistance of the spin synapse device changes according to the angle formed by the spin direction of the first free layer 430 and the second free layer 460, and the spin direction of the pinned layer 410. The MTJs of the two regions can be implemented the multi-bits operation.

The spin synapse device of FIGS. 13 and 14 are a basic structure for implementing multi-bit.

FIG. 15 is a schematic view of a method of forming a first free layer having multiaxial magnetic anisotropy according to a modified embodiment of the present invention.

FIG. 16 is a schematic view of anisotropic structure of a free layer having multiaxial magnetic anisotropy according to a modified embodiment of the present invention.

Referring to FIGS. 15 and 16, after the first electrode is formed on the sample substrate 500, the ferromagnetic layer 510 is formed on the first electrode while applying a magnetic field in the chamber. Subsequently, after the sample having the ferromagnetic layer 510 formed thereon is loaded into the electric furnace, it is heated for at least 10 minutes in a range of 300° C. to 1500° C. while applying a magnetic field.

The crystal orientation 540 of the ferromagnetic layer 510 is adjusted through proper selection of the sample substrate 500 and crystal growth of the electrode layer.

A free layer having multiaxial magnetic anisotropy can be formed by using the overall shape of the ferromagnetic layer 510, by using the magnetic field applied at the time of forming the ferromagnetic layer 510, and by using the magnetic field applied at the time of heat treatment.

Furthermore, at the time of manufacturing the ferromagnetic layer 510, the crystal growth of the magnetic layer is controlled to produce a magnetic anisotropy axis according to the crystallinity of the ferromagnetic layer 510, and thus a free layer having magnetic anisotropy having several axes can be manufactured and may have magnetocrystalline anisotropy. This multiaxial magnetic anisotropy can be used as a multi-bit memory when applied to an MTJ on the same principle as a spin valve, which becomes a basic element of the spin synapse structure.

In addition, the free layers having different magnetization directions can be stacked to form multiple layers having shape magnetic anisotropy, and the laminated free layer can be used to realize magnetic anisotropy. In this case, the degree of weighting of the spin synapse structure can be controlled more finely.

When a free layer is formed into a multi-layer structure, each free layer in the multi-layer structure may be changed in magnetization direction each time the free layer is formed, thereby making it easier to implement a multi-bit according to the change of the direction of the free layer of the multi-layer structure.

FIG. 17 is a detached perspective view showing basic structure of a spin synapse device having a free layer, a tunnel barrier layer, and a pinned layer formed according to a modified embodiment of the present invention.

Referring to FIG. 17, a tunnel barrier layer 620 is formed between the free layer 630 and the pinned layer 610, and the spin direction of the free layer 630 is formed in the −x axis direction. The spin direction of the free layer 630 and the spin direction of the pinned layer 610 are opposite to each other and the magnetoresistance of the spin synapse device in the vertical direction is maximized.

FIG. 18 is a graph showing the formation of the spin direction of the free layer according to the modified embodiment of the present invention at intervals of 45°.

Referring to FIG. 18, the spin direction of the free layer on the same surface is set to an 0° axis 740, a 315° axis 750, a 270° axis 760, a 225° axis 770 and a 180° axis 780.

FIG. 19 is a schematic diagram illustrating a spin direction conversion by applying a current pulse to a spin synapse device while maintaining a current level of a spin synapse device according to a modified embodiment of the present invention.

Referring to FIG. 19, a current pulse is not applied to the spin synapse device, and the spin direction 810 of the free layer 630 is in a direction opposite to the pinned layer 610, whereby the magnetoresistance of the spin synapse device has the maximum value (Resistance High; HR).

When the first current pulse is inputted to the first electrode 400 of the spin synapse device, the spin of the free layer 630 generates a torque, the spin direction 820 rotates by 45°, and forms angle of 135° with the spin direction of the pinned layer. Then, applying a second current pulse causes the spin direction 830 of the free layer 630 to further rotate by 45° to form 90° difference with the spin direction of the pinned layer 610. Then, when a third current pulse is applied, the spin direction 840 of the free layer 630 is further rotated by 45° to form 45° difference with the spin direction of the pinned layer 610. The current pulse is gradually applied through the first electrode 400 so that the spin direction of the free layer 630 is rotated and the magnetoresistance of the spin synapse device is gradually decreased.

A current pulse is further applied to the spin synapse device so that the spin direction 850 of the free layer 630 and the spin direction of the pinned layer 610 become the same direction and the magnetoresistance of the spin synapse device becomes the state of the minimum value (Resistance Low; RL).

When the current pulse as described above is applied to the spin synapse device, the current value inputted into the spin synapse device is kept constant, but the magnetoresistance value of the spin synapse device is reduced.

FIG. 20 is a graph showing a quantitative change in magnetoresistance of a spin synapse device by applying a current pulse to a spin synapse device according to a modified embodiment of the present invention.

Referring to FIG. 20, the magnetoresistance of the spin synapse device is RH which is the maximum resistance state, and the magnetoresistance is cumulatively decreased by R0, R1, R2, R3 as the current pulse is stepwise applied to the spin synapse device.

The spin direction of the free layer 630 is equal to the spin direction of the pinned layer 610 by applying the current pulse stepwise, and the magnetoresistance of the spin synapse device reaches the minimum value. It is possible to change the magnetoresistance value of the spin synapse device without changing the value of the current flowing through the spin synapse device, so that the spin synapse device is driven at a low power and it is possible to manufacture a low power memory using the same.

FIG. 21 is a schematic diagram for reading a magnetoresistance and writing a spin synapse device at which a current pulse is applied according to a modified embodiment of the present invention.

Referring to FIG. 21, as the current pulse is applied to the spin synapse device and the spin direction of the free layer 630 is changed by the pulse current, the magnetoresistance of the spin synapse device is changed. The state of the spin synapse may be known through a read operation on the changed magnetoresistance.

Also, if the magnetoresistance R1 is read by applying a current pulse to the spin synapse device, it can be confirmed that the magnetoresistance is R0 before the current pulse is applied, and the spin direction of the spin synapse device can be recognized. This process is repeated to realize the write operation and read operation.

FIG. 22 is a predictive graph of excitation and suppression for a spin synapse device according to a modified embodiment of the present invention.

Referring to FIG. 22, the spin synapse device can be operated by the current pulse, and the magnetoresistance of the spin synapse device changes according to the current pulse. It is also expected that spin synapse devices will exhibit linear excitation and suppression.

When a current pulse is applied to the spin synapse device, the magnetoresistance of the spin synapse device is changed. Further, as the current pulse is continuously applied until the magnetoresistance becomes the minimum value, the current flowing to the spin synapse device can be the maximum value. It is similar to a kind of synapse excitation state that the continuous pulse current is applied and the current flowing to the spin synapse device increases. Subsequently, after the magnetoresistance of the spin synapse device becomes the minimum, the magnetoresistance of the spin synapse device increases when the pulse current is continuously applied. This is because the current pulse of the spin synapse device is in the opposite direction, and the spin synapse device is in a suppression state.

It can also be seen that the graph shape for the excitation and suppression of the spin synaptic device does not change even after more than 106 cycles of the spin synapse device.

The MTJ having multiaxial magnetic anisotropy enables a multi-bit operation, and the spin synapse device including the MTJ can greatly increase its capacity by replacing the conventional binary memory, and it can also be used as a synapse device suitable for artificial neural network technology.

FIG. 23 is a schematic diagram for excitation and suppression of a spin synapse device according to a modified embodiment of the present invention.

Referring to FIG. 23, when the spin direction of the free layer and the spin direction of the pinned layer are in the same direction, the magnetoresistance of the spin synapse device is in a minimum state. As a current pulse is applied to such a spin synapse device, the spin direction of the free layer changes on the same plane, and the magnetoresistance of the spin synapse device increases.

The state in which the spin direction of the free layer forms 180° with the spin direction of the pinned layer is a state in which the magnetoresistance of the spin synapse device becomes the maximum value. Therefore, if the current pulse is continuously applied to the spin synapse device, the maximum value is obtained. When the current pulse is continuously applied in a state where the magnetoresistance of the spin synapse device is at its maximum value, the magnetoresistance of the spin synapse device is reduced in accordance with the change of the spin direction of the free layer.

FIG. 24 is a graph showing a comparison between a spin synapse device and a STT-MRAM according to a modified embodiment of the present invention.

Referring to (a) and (b) of FIG. 24, (a) is a spin synapse device of a magnetic domain wall type, and when a current pulse is applied to the spin synapse device, the magnetoresistance of the spin synapse device changes stepwise, RH to RL, and it is possible to manufacture a synapse device to be controlled in multiple stages. The (b) is of the STT-MRAM type, and when a current pulse is applied to the STT-MRAM, only the magnetoresistance of RH or RL is obtained.

Production Example 3

The first free layer 430 is made of ferromagnetic material and is formed of CoFeAl with a thickness of 55 nm on the first tunnel barrier layer 420 having excellent crystallinity.

Subsequently, the formed CoFeAl is subjected to heat treatment at a high temperature of 400° C. or more for 10 minutes or more using a heater.

Evaluation Example 3

The residual magnetization of the CoFeAl thin film formed in Production Example 3 is confirmed by the angle. The residual magnetization is large at the angle of magnetic anisotropy, and the residual magnetization decreases as the distance from the direction of magnetic anisotropy increase. Therefore, the residual magnetization is a measure for confirming the direction of magnetic anisotropy. The magnetic anisotropy of the fabricated CoFeAl thin films showed biaxial magnetic anisotropy with two axes of 0° and 90°.

The invention claimed is:

1. A spin device comprising:
an electrode formed on a substrate;
a free layer formed on the electrode and generating a magnetic domain wall movement in accordance with a spin orbit torque;
a tunnel barrier layer formed on the free layer and being made of non-magnetic material; and
a pinned domain layer disposed on the tunnel barrier layer and having fixed magnetization direction,
wherein the pinned domain layer includes:
a pinned layer disposed on the tunnel barrier layer,
a first non-magnetic layer formed on the pinned layer;
a first multi-layer disposed on the first non-magnetic layer;
a second non-magnetic layer disposed on the first multi-layer; and
a second multi-layer disposed on the second non-magnetic layer,
wherein the free layer performs neuron operation by domain wall movement due to application of current pulse.

2. The spin device of claim 1, wherein the free layer has at least one selected from the group consisting of CoFeB, CoNi and CoPd.

3. The spin device of claim 1, wherein the tunnel barrier layer is metal oxide, and the metal oxide is composed of at least one selected from the group consisting of $HfO_2$, $ZrO_2$, $AlO_x$, $SiO_2$, MgO and $Ta_2O_3$.

4. The spin device of claim 1, wherein the electrode being a source of spin is has at least one selected from the group consisting of Ta, Hf, W, Nb and an alloy thereof.

5. The spin device of claim 1, wherein the first non-magnetic layer and the second non-magnetic layer have at least one selected from the group consisting of Ru, Ta, W and Cu.

6. The spin device of claim 1, wherein the first multi-layer and the second multi-layer have spin directions fixed in directions opposite to each other.

7. The spin device of claim 1, wherein the first multi-layer and the second multi-layer have structure in which Co and Pd are alternately formed, and the magnetization intensity of the first multi-layer is smaller than the magnetization intensity of the second multi-layer.

8. The spin device of claim 1, wherein a surface area of the pinned domain layer disposed on the substrate is in a range of 5% to 50% of a surface area of the free layer.

9. A method of operating a spin device having an electrode disposed on a substrate, a free layer disposed on the electrode and capable of moving a domain wall, a tunnel barrier layer formed on the free layer, and a pinned domain layer formed on the tunnel barrier layer, comprising:
applying a current pulse to the electrode in a direction parallel to the surface of the electrode;
moving the domain wall of the free layer due to the current pulse;
changing magnetoresistance of the spin device by movement of the magnetic domain wall of the free layer;
forming magnetization direction of the free layer in a direction opposite to magnetization direction of the pinned domain layer after the magnetoresistance of the spin device changes stepwise and the magnetoresistance is saturated;
applying a current pulse in a direction opposite to the direction of the current pulse applied to the electrode, after the magnetoresistance reaches a maximum and the magnetization direction of the free layer is formed in a direction opposite to the magnetization direction of the pinned domain layer;

decreasing the magnetoresistance of the spin device in stages due to movement of the magnetic domain wall; and minimizing the magnetoresistance and forming the magnetization direction of the free layer in the same direction as the magnetization direction of the pinned domain layer.

10. The method of claim 9, wherein an area occupied by the pinned domain layer on the free layer is in a range 5% to 50% of a surface area of the free layer.

* * * * *